(12) United States Patent
Dunnihoo et al.

(10) Patent No.: US 7,479,680 B2
(45) Date of Patent: Jan. 20, 2009

(54) METHOD AND APPARATUS THAT PROVIDES DIFFERENTIAL CONNECTIONS WITH IMPROVED ESD PROTECTION AND ROUTING

(75) Inventors: Jeffrey C Dunnihoo, Bertram, TX (US); Chadwick N. Marak, San Jose, CA (US); Michael S. Evans, Los Gatos, CA (US)

(73) Assignee: California Micro Devices, Milpitas, CA (US)

( * ) Notice: Subject to any disclaimer, the term of this patent is extended or adjusted under 35 U.S.C. 154(b) by 416 days.

(21) Appl. No.: 11/291,521

(22) Filed: Nov. 30, 2005

(65) Prior Publication Data

US 2007/0120192 A1    May 31, 2007

(51) Int. Cl.
*H01L 23/62* (2006.01)
(52) U.S. Cl. .................... 257/355; 257/546; 257/666; 257/691; 257/692; 257/697
(58) Field of Classification Search ......... 257/355–357, 257/173, E23.001–E23.194, 666–677, 690–696, 257/773–786, E23.031–E23.059
See application file for complete search history.

(56) References Cited

U.S. PATENT DOCUMENTS

| | | | | |
|---|---|---|---|---|
| 6,246,122 B1 * | 6/2001 | Lin | ................................ | 257/786 |
| 6,538,304 B1 * | 3/2003 | White | .......................... | 257/666 |
| 6,762,507 B2 * | 7/2004 | Cheng et al. | ................. | 257/786 |
| 2006/0071320 A1 * | 4/2006 | Shibata et al. | .............. | 257/691 |

* cited by examiner

*Primary Examiner*—Jasmine J Clark
(74) *Attorney, Agent, or Firm*—Pillsbury Winthrop Shaw Pittman LLP

(57) ABSTRACT

The present invention provides a single ESD device package that can be used to provide ESD protection to multiple high-speed lines, in particular multiple high-speed differential lines. The present invention has various aspects. Minute parasitic matching is achieved within a single package, and TMDS signal discontinuities are reduced by allowing uniform straight through routing. Also, the straight through routing and pin locations are matched to allow those straight routing lines to mate directly to high speed lines. Also, straight ground lines having a single via are associated with the straight through routing lines.

22 Claims, 7 Drawing Sheets

"Shortest Path" Ground Returns (Four Lines Shown In Grey) Provide Single Point Grounding For ESD And Parasitic Losses At The Connector "Shortest Path" Ground Returns (Four Lines Shown In Grey) Provide Single Point Grounding For ESD And Parasitic Losses At The Connector

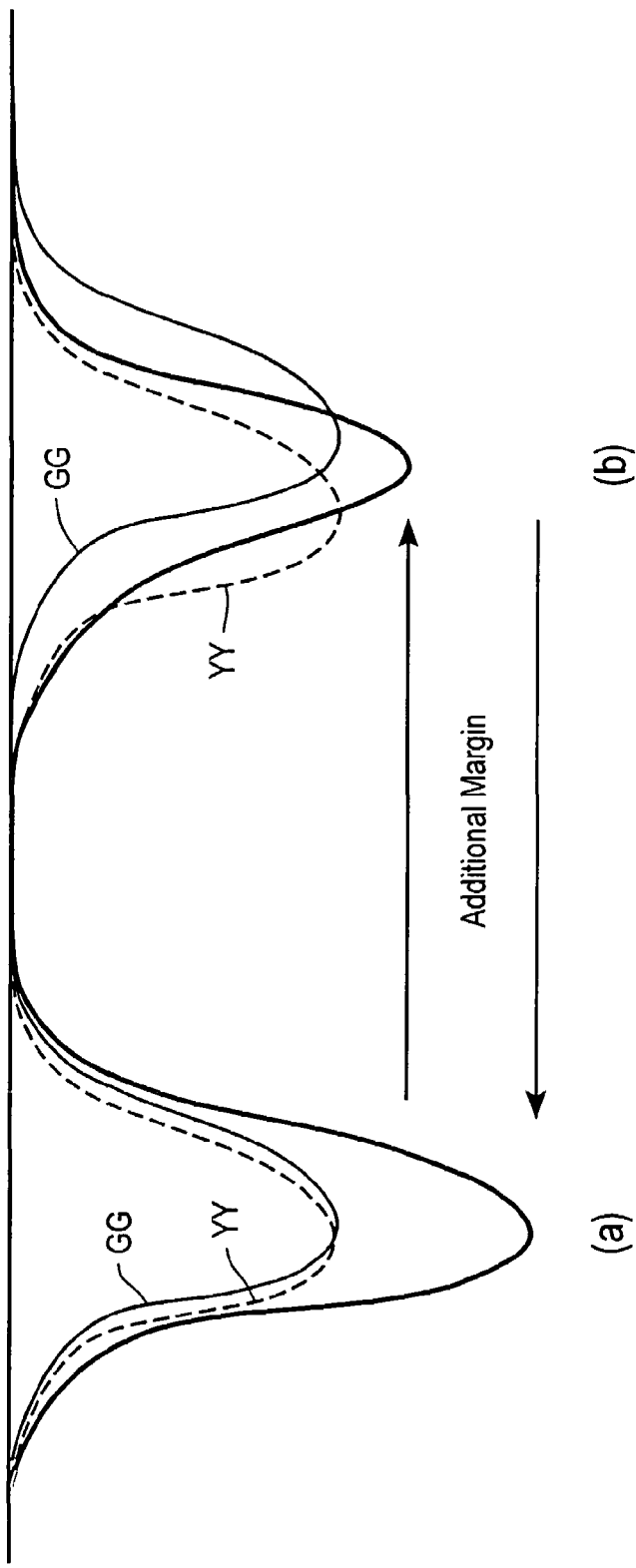

Advantage Of Bonding Alternate Sides Of TMDS Pair To ESD Structures. When D+ (Green/GG) And D- (Yellow-YY) Are Bonded At The Same Distance From The Connector, The Additive Single Ended Impedance Is See During The HDMI TDR Test As An Additive "Lump Sum" Minimum In The Impedance Plot (a). When The Same ESD Loads Are Bonded To Opposite Sides Of The Package, The Resultant Differential Impedance Minimum Is Reduced, Allowing More Margin In HDMI Compliance

FIG. 6

METHOD AND APPARATUS THAT PROVIDES DIFFERENTIAL CONNECTIONS WITH IMPROVED ESD PROTECTION AND ROUTING

BACKGROUND OF THE INVENTION

1. Field of the Invention

The present invention relates to a method and apparatus that provides differential connections with improved ESD protection and routing, and particularly a method and apparatus that provides differential connections which meet HDMI and DVI specifications.

2. Background of the Related Art

When routing high speed data signals between two points, it is well-known that many competing considerations exist in order to maintain the integrity of the signals.

For certain high speed lines, there is desired to maintain both integrity of the signal, as well as obtain electrostatic discharge (ESD) protection. These considerations can be at odds with each other, since providing ESD protection requires some type device that will add a capacitance or inductance to the line, thereby having an adverse effect on signal integrity.

In particular, HDMI has 4 pairs of differential, high speed data lines (TMDS lines) that must have tightly controlled impedance levels from an HDMI connector to the actual processing chip. Between the connector and this processing chip run impedance matched lines that are centered at 100 ohms and can differ by no more than +/−15% based on the HDMI specification. Adding any ESD device on top of these lines (i.e. capacitance and inductance) can cause discontinuities in the impedance producing a failure (according to the HDMI spec).

As a result, conventional interface devices that offer ESD protection for the HDMI and DVI specifications use multiple ESD protection chips or, as illustrated in FIGS. 1(a)-(c) route high speed lines in various circuitous paths, which then also lead to non-uniform parasitic return path impedance. As such, there is a significant increase in impedance discontinuities and increase induced parasitics when routed normally. Further, a greater area of board space is consumed. As a result, greater signal skew exists at the receiver because of uncontrolled parasitics from the different ESD devices.

SUMMARY OF THE INVENTION

The present invention provides a single ESD device package that can be used to provide ESD protection to multiple high-speed lines, in particular multiple high-speed differential lines.

In one aspect of the invention, minute parasitic matching is achieved within a single package.

In another aspect of the invention, TMDS signal discontinuities are reduced by allowing uniform straight through routing. Such uniform straight through routing provides full ESD protection with improved impedance matching, which saves board space by integrating multiple functions.

In another aspect, the straight through routing and pin locations are matched to allow those straight routing lines to mate directly to high speed lines, such as high speed lines that are within the standard HDMI PTH or SMT connector.

In another aspect of the invention, straight ground lines having a single via are associated with the straight through routing lines.

SUMMARY OF THE DRAWINGS

The above and other aspects of the present invention will become readily apparent when reading the following detailed description taken in conjunction with the appended drawings in which:

FIG. 6 illustrates the additive nature of the differential impedance minimum according to a preferred embodiment of the present invention.

DETAILED DESCRIPTION OF THE PREFERRED EMBODIMENT

The present invention provides a single ESD device package that can be used to provide ESD protection to multiple high-speed lines, in particular multiple high-speed differential lines, such as TDMS lines of HDMI, or other lines subject to parasitics.

Figure 3A:
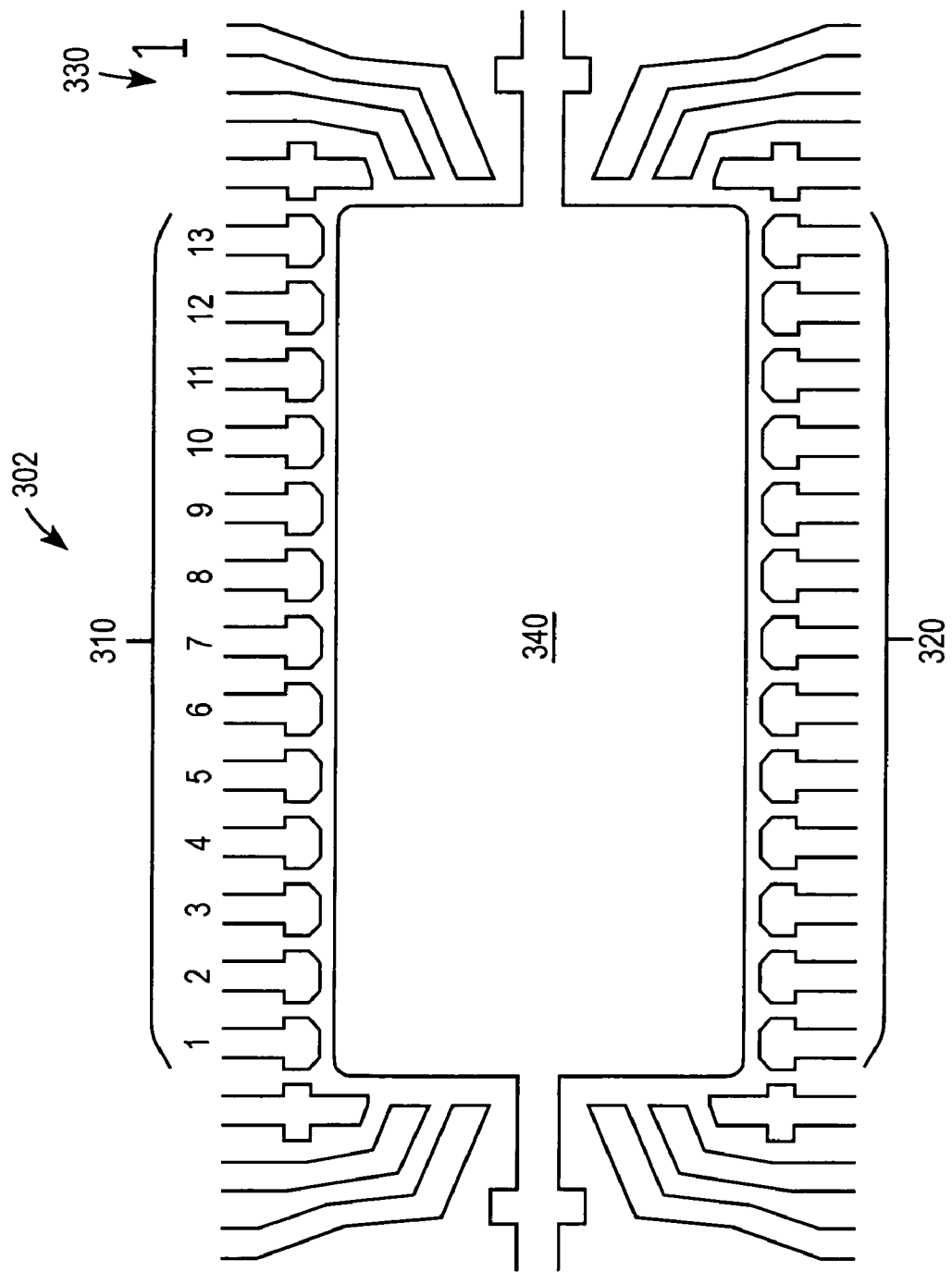
FIG. 3(a) illustrates a leadframe package according to a preferred embodiment of the present invention.
Figure 3B:
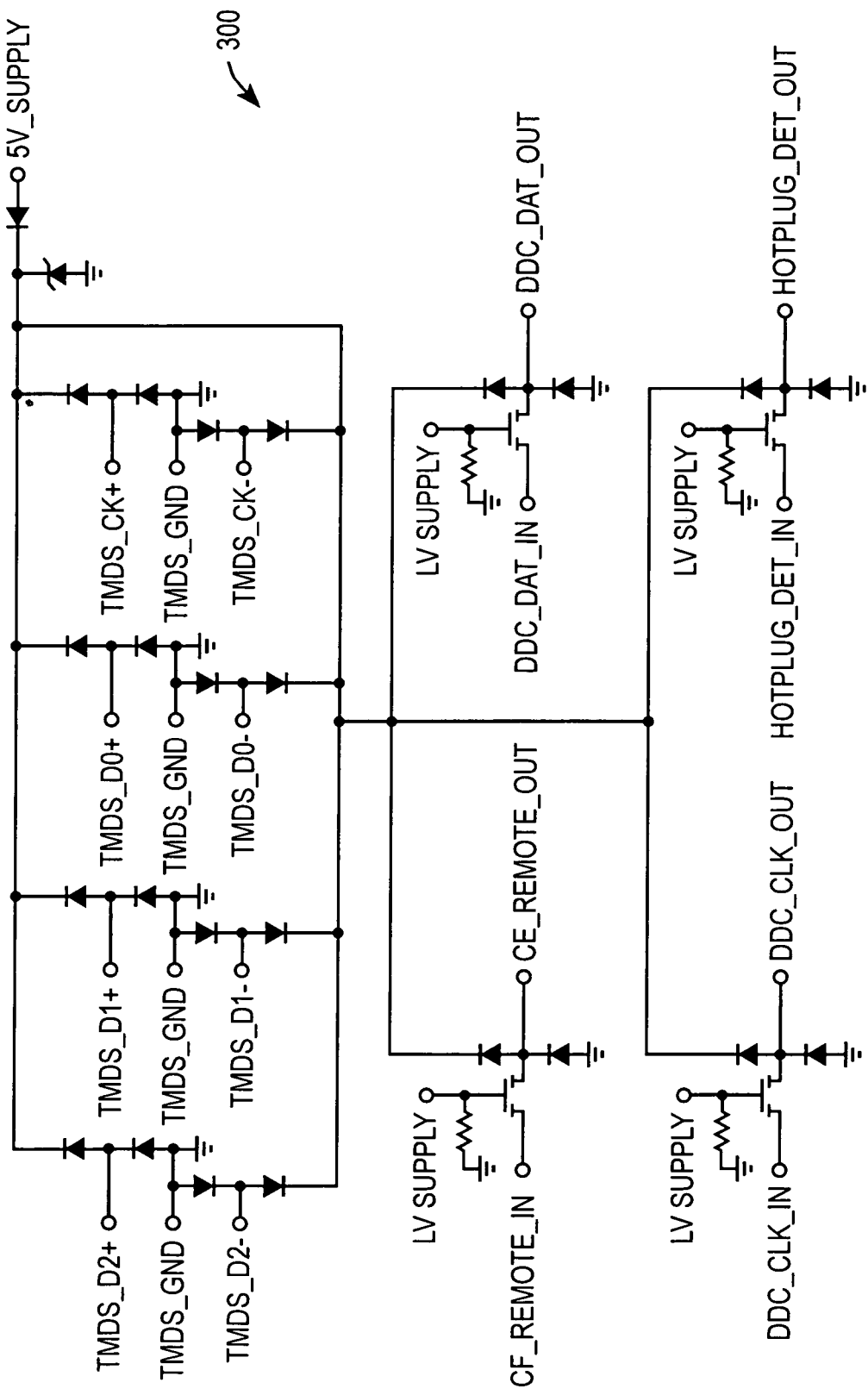
FIG. 3(b) illustrates a particular ESD circuit for use with the leadframe package of FIG. 3(a) according to a preferred embodiment of the present invention.

FIGS. 3(a) and 3(b) illustrates one aspect of the single ESD device package, which in this embodiment is for an HDMI interface that has four different differential TDMS lines. As illustrated in FIG. 3(a), the leadframe 302 contains symmetrical central leadframe pins 310 on one side of the leadframe 302, another set of symmetrical central leadframe pins 320 on the other side of the leadframe 302, and peripheral leadframe pins 330. It is noted that the pins 310 and 320 have relatively uniform internal dimensions as well as are straight, thus keeping the resultant parasitic TMDS lines skewed equally, as compared to bonding to the peripheral leadframe pins 330.

Area 340 of the leadframe will, as is known, have the die (not shown) which has pads that allow for bonding between the pads and the leadframe pins. FIG. 3(b) illustrates a particular ESD circuit device 300 for use with the leadframe package of FIG. 3(a) according to a preferred embodiment of the present invention. The usage of the various ESD components (which in the specific embodiment are diodes) provides ESD protection provide a particularly advantageous for a specific HDMI, but there are also broader aspects of the invention that are not related to the specific circuit implementation or the type of ESD components used for ESD protection. It is noted that the level shift part of the circuit uses the leadframe pins 330, as these level shift signals are not critical, and thus allow for the central leadframe pins 310 and 320 to be used for the high speed lines.

The pinout shown in FIG. 3(a) is specifically illustrated for an HDMI embodiment, in which the symmetrical central leadframe pins 310 and 320 are chosen to match the HDMI pinout. In particular, with the leadframe pins 310 matching the HDMI pinout, this allows for the closest routing between the ESD package and the HDMI connector.

Figure 5:
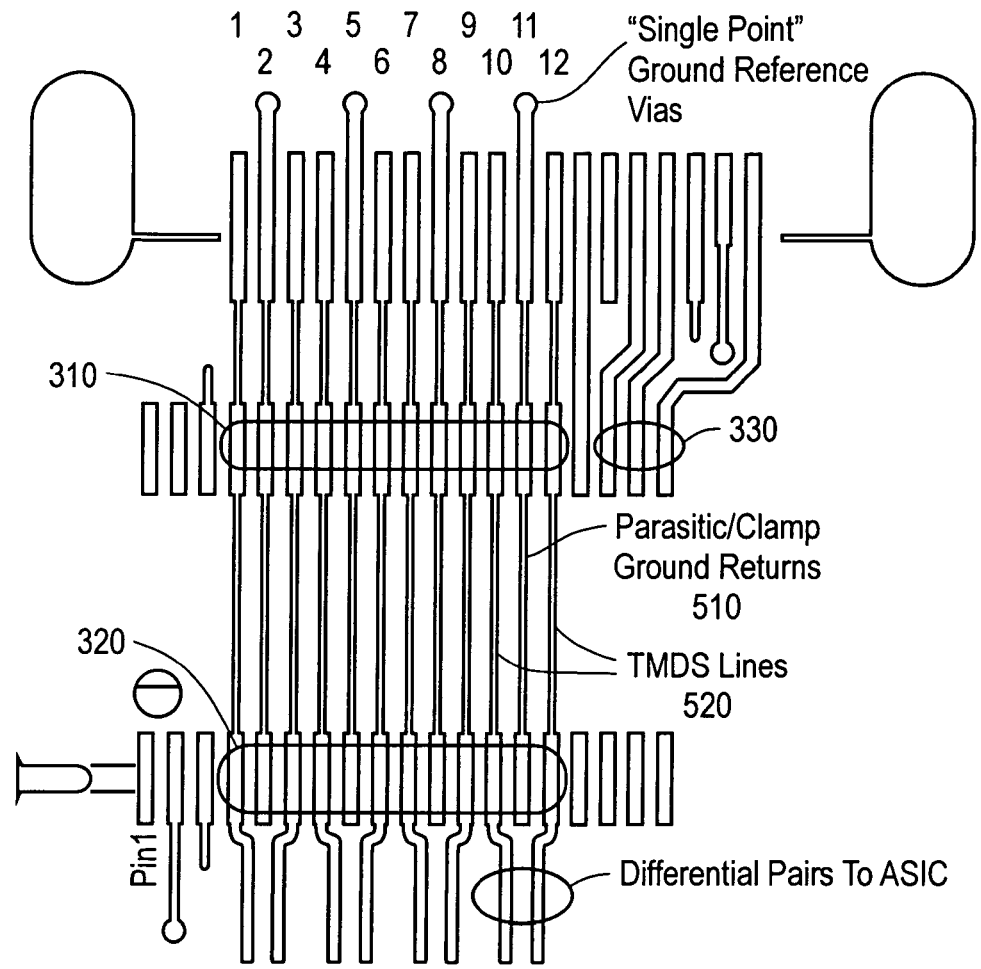
FIG. 5 illustrates the usage of straight through routing and shortest path ground returns according to a preferred embodiment of the present invention.

FIG. 5 illustrates the preferred embodiment which uses a 38 TSSOP package with 0.5 mm pitch, in which the leadframe pins 310 and 320 line up directly with the 0.5 mm HDMI connector, thus allowing straight-through routing of the controlled impedance lines (specifically the high speed TMDS lines in HDMI) minimizing the distance of the ESD protection from the connector, minimizing the PCB layout space required in a single layer, and controlling the impedance parasitics without need for return vias to internal ground planes for ground returns.

As is also reflected by FIG. 5, the package is able to mate closely with the HDMI connector, which thus allows the parasitics of both to be lumped together, allowing for a more continuous matched impedance on the path to the processing device.

FIG. 5 illustrates the running the GND lines 510 between the TMDS differential line pairs 520 according to the present invention, in addition to the straight through routing of the TMDS differential pairs 520 as mentioned above. While the placement of the ground lines 510 undesirably (when viewed as the only variable) de-couples the differential pairs for the short distance underneath the ESD protection device, this de-coupling is offset by the advantages of enhanced single-point ground return path using the line pairs 510, which single point return path does not require any vias or other configurations, as also mentioned previously.

FIG. 5 also illustrates grouping these TMDS differential line pairs 520 toward the center of the package, which ensures that all packaging parasitic capacitances and inductances are minimized. As mentioned above, the symmetric central pins 310, 320 of the package (labeled 1-13 in on side 310 of the leadframe illustrated in FIG. 3(a) correspond to the various lines labeled 1-13 in FIG. 5 (which lines 1-12 are illustrating both the HDMI connector as well as the ESD device described herein, as the peripheral leadframe pins 330 on a typical package usually have much higher parasitic values as compared to the symmetrical central leadframe pins 310 and 320.

Figure 1C:
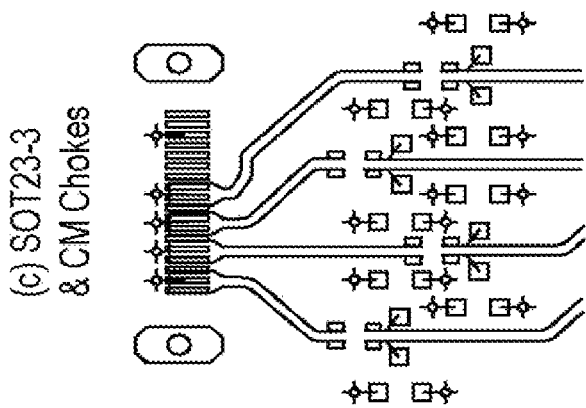
FIGS. 1(a)-(c) illustrate conventional circuitous routing footprints of conventional ESD packages.
Figure 1B:
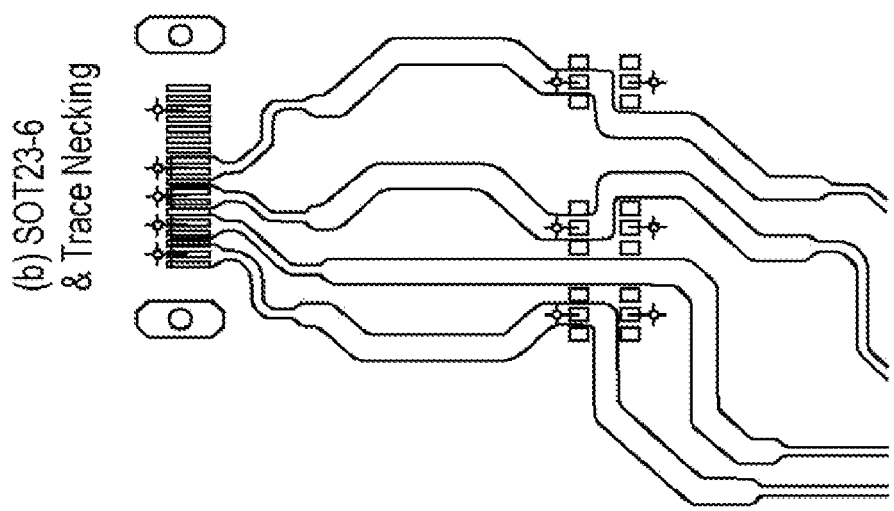
Figure 1A:
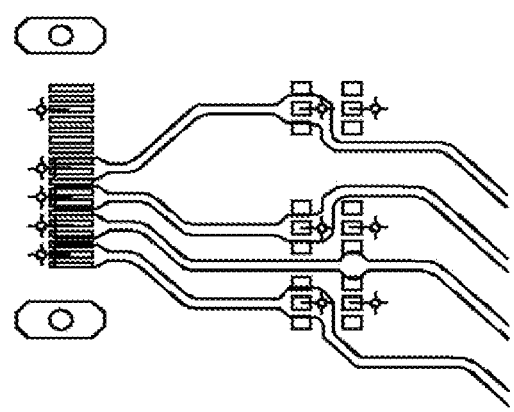
Figure 2:
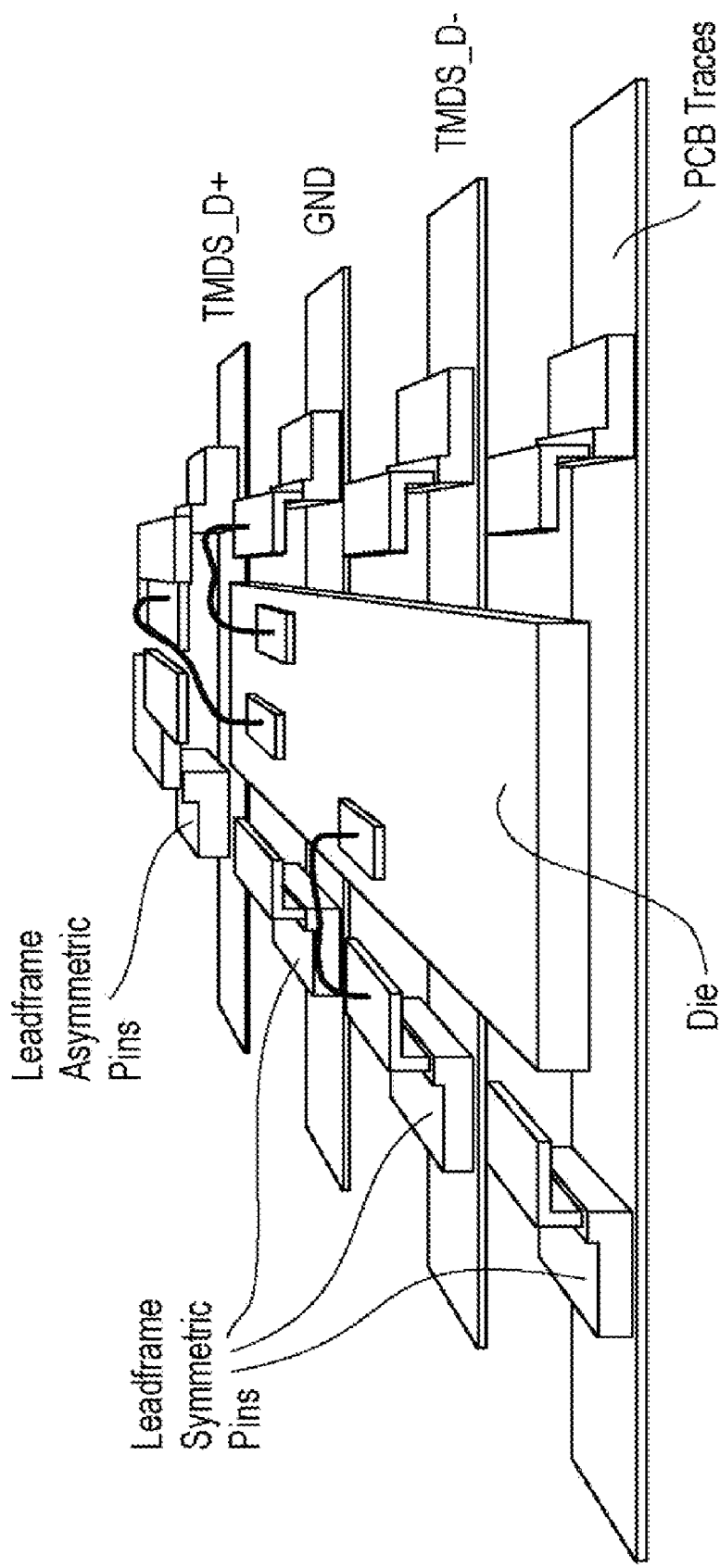
FIG. 2 illustrates a perspective view of an asymmetric data line implementation that is representative of the prior art.
Figure 4:
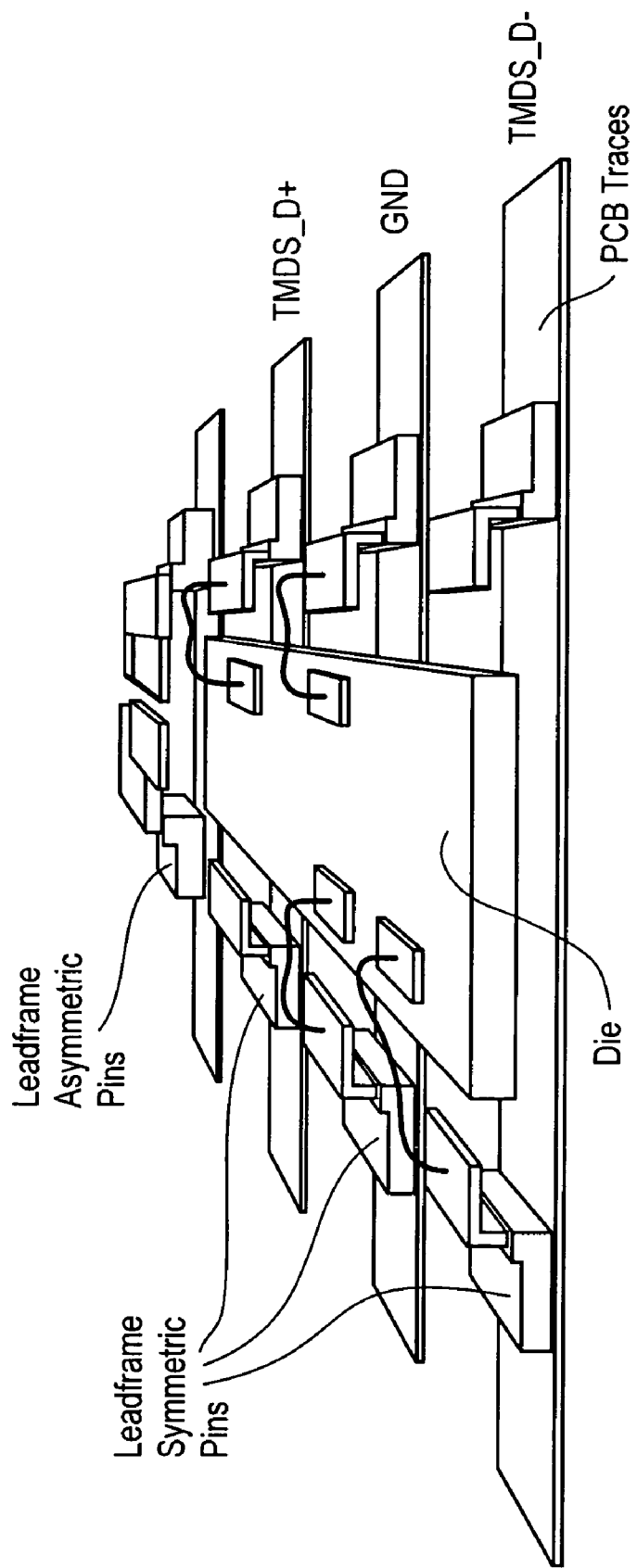
FIG. 4 illustrates a perspective view of a representative symmetric data line implementation according to a preferred embodiment of the present invention.

Another aspect of the invention is seen from a comparison of a representative conventional package as shown in FIG. 2 that illustrates a perspective view of an asymmetric data line implementation with the configuration shown in FIG. 4 of a perspective view of a representative symmetric data line implementation according to a preferred embodiment of the present invention. Thus, by bonding the "D+" ESD clamp to one side of the device and bonding the "D−" ESD clamp to the other side of the device, the summed TDR impedance of the trace at the minima caused by the parasitic loading of the ESD devices is skewed slightly without introducing any signal skew at the receiver, as is graphically illustrated in FIG. 6. This is superior to alternative layouts (mentioned previous as FIGS. 1a-c) where the precise loading of the pair cannot be accurately controlled.

It is noted that in operation, typically the signal will pass through the PCB traces as illustrated in FIG. 4. When an overvoltage condition occurs, however, the stub connection of the ESD package described by the present invention allows the ESD protection circuitry to serve its purpose.

Modifications and variations of the preferred embodiment will be readily apparent to those skilled in the art. Such variations are within the scope of the present invention as defined by the claims.

The invention claimed is:

1. An integrated circuit electrostatic discharge protection device that reduces parasitics on a printed circuit board to which the device is mounted, the device comprising:
   an integrated circuit chip that includes a plurality of ESD elements;
   a plurality of pads disposed on a periphery of the integrated circuit, the plurality of pads including:
   a first set of pads disposed on a first central peripheral region on a first side of the integrated circuit chip;
   a second set of pads disposed on a second central peripheral region on a second side of the integrated circuit chip, the second central peripheral region and the first central peripheral region being on opposite sides of the integrated circuit chip and being aligned with each other;
   a third set of pads disposed on edge peripheral regions of the integrated circuit chip;
   a leadframe package having pins that correspond to positions of the plurality of pads, including first symmetric central leadframe pins that correspond to the first set of pads, second symmetric central leadframe pins that correspond to the second set of pads, and third leadframe pins that correspond to the third set of pads; and
   a plurality of wires that each connect between one of the pads and one of the pins of the leadframe package, wherein
   the first and second symmetric central leadframe pins are straight and project perpendicularly from the leadframe package.

2. An integrated circuit electrostatic discharge protection device that reduces parasitics on a printed circuit board to which the device is mounted, the device comprising:
   an integrated circuit chip that includes a plurality of ESD elements;
   a plurality of pads disposed on a periphery of the integrated circuit, the plurality of pads including:
   a first set of pads disposed on a first central peripheral region on a first side of the integrated circuit chip;
   a second set of pads disposed on a second central peripheral region on a second side of the integrated circuit chip, the second central peripheral region and the first central peripheral region being on opposite sides of the integrated circuit chip and being aligned with each other;
   a third set of pads disposed on edge peripheral regions of the integrated circuit chip;
   a leadframe package having pins that correspond to positions of the plurality of pads, including first symmetric central leadframe pins that correspond to the first set of pads, second symmetric central leadframe pins that correspond to the second set of pads, and third leadframe pins that correspond to the third set of pads; and
   a plurality of wires that each connect between one of the pads and one of the pins of the leadframe package wherein,
   the printed circuit board includes a plurality of straight through parallel routing lines and, interposed between some of the straight through parallel routing lines is a ground line, each ground line being parallel to the straight parallel ground lines.

3. The apparatus according to claim 2 wherein the straight through parallel routing lines are paired such that each pair is adapted to connect to a differential signal, and between each pair of straight through parallel routing lines is one of the ground lines.

4. The apparatus according to claim 3 wherein the straight through parallel routing lines are aligned with TMDS lines of an HDMI connector.

5. The apparatus according to claim 3 wherein the straight through parallel routing lines are aligned with high-speed lines of an HDMI defined connector.

6. The apparatus according to claim 3 wherein each of the ground lines has a single via associated therewith.

7. The apparatus according to claim 2 wherein each of the ground lines has a single via associated therewith.

8. The apparatus according to claim 2 wherein the straight through parallel routing lines are paired such that each pair is adapted to connect to a differential signal, and, for each pair, one of the straight through parallel routing lines connects to one of the first set of pads, the other of the straight through parallel routing lines connects to one of the second set of pads, and the wires connecting the pair are on opposite sides of the integrated circuit chip.

9. An integrated circuit electrostatic discharge protection device that reduces parasitics on a printed circuit board to which the device is mounted, the device comprising:

an integrated circuit chip that includes a plurality of ESD elements;

a plurality of pads disposed on a periphery of the integrated circuit, the plurality of pads including:

a first set of pads disposed on a first central peripheral region on a first side of the integrated circuit chip;

a second set of pads disposed on a second central peripheral region on a second side of the integrated circuit chip, the second central peripheral region and the first central peripheral region being on opposite sides of the integrated circuit chip and being aligned with each other;

a third set of pads disposed on edge peripheral regions of the integrated circuit chip;

a leadframe package having pins that correspond to positions of the plurality of pads, including first symmetric central leadframe pins that correspond to the first set of pads, second symmetric central leadframe pins that correspond to the second set of pads, and third leadframe pins that correspond to the third set of pads; and a plurality of wires that each connect between one of the pads and one of the pins of the leadframe package, wherein other circuits having signals that are not sensitive to parasitics are connected to the third set of pads.

10. The apparatus according to claim 9 wherein the other circuits include level shift circuits.

11. A circuit module comprising:

a printed circuit board that includes a plurality of straight through parallel routing lines;

a connector mounted to the printed circuit board, the connector having connection pins that are associated with a plurality of high-speed lines;

a processor mounted to the printed circuit board, the processor having inputs for the high speed lines;

a plurality of parallel printed circuit board trace connections that electrically connect each of the high speed lines on the connection pins to the respective processor inputs; and an ESD package having a plurality of central pins on opposite sides of the ESD package, wherein the plurality of straight through parallel routing lines connect opposite central pins, and a plurality of ESD elements, wherein the high speed lines are each connected to one of the central pins on the ESD package that is also electrically connected to one of the parallel printed circuit board trace connections.

12. The apparatus according to claim 11 wherein the high speed lines are aligned with the parallel printed circuit board trace connections.

13. The apparatus according to claim 11 wherein, interposed between some of the straight through parallel routing lines is a ground line, each ground line being parallel to the straight parallel ground lines.

14. The apparatus according to claim 13 wherein each of the ground lines has a single via associated therewith.

15. The apparatus according to claim 11 wherein the straight through parallel routing lines are paired such that each pair is adapted to connect to a differential signal that is transmitted along a pair of the high-speed lines.

16. The apparatus according to claim 15 wherein the plurality of parallel printed circuit board trace connections and the straight through parallel routing lines are aligned with TMDS lines of an HDMI connector.

17. The apparatus according to claim 16 wherein the plurality of parallel printed circuit board trace connections and the straight through parallel routing lines are aligned with lines of an HDMI defined connector.

18. The apparatus according to claim 11 wherein the ESD package includes other circuits having signals that are not sensitive to parasitics and which other circuits are connected to peripheral pins.

19. The apparatus according to claim 18 wherein the other circuits include level shift circuits.

20. The apparatus according to claim 18 wherein the central pins are straight.

21. The apparatus according to claim 11 wherein the straight through parallel routing lines are paired such that each pair is adapted to connect to a differential signal, and, for each pair, one of the straight through parallel routing lines connects to one of the central pins on one side of the ESD package and the other of the straight through parallel routing lines connects to one of the central pins on the opposite side of the ESD package.

22. The apparatus according to claim 11 wherein the connector and the ESD package are connected sufficiently close together so as to present a single parasitic event.

\* \* \* \* \*